(12) United States Patent  
Anderson et al.

(10) Patent No.: US 8,546,252 B2  
(45) Date of Patent: Oct. 1, 2013

(54) METAL GATE FET HAVING REDUCED THRESHOLD VOLTAGE ROLL-OFF

(75) Inventors: Brent A. Anderson, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 566 days.

(21) Appl. No.: 12/573,440

(22) Filed: Oct. 5, 2009

(65) Prior Publication Data

US 2011/0079828 A1 Apr. 7, 2011

(51) Int. Cl.  
*H01L 29/72* (2006.01)

(52) U.S. Cl.  
USPC .............. 438/592; 257/E21.19; 257/E29.255; 257/288; 438/183; 438/199; 438/270; 438/275; 438/561; 438/587; 438/595

(58) Field of Classification Search  
USPC ................. 438/592, 183, 199, 270, 275, 561, 438/587, 595  
See application file for complete search history.

(56) References Cited

U.S. PATENT DOCUMENTS

| | | |
|---|---|---|
| 4,755,478 A | 7/1988 | Abernathey et al. |
| 5,015,599 A | 5/1991 | Verhaar |
| 5,061,647 A | 10/1991 | Roth et al. |
| 5,210,435 A | 5/1993 | Roth et al. |
| 6,187,657 B1 | 2/2001 | Xiang et al. |
| 6,274,467 B1 | 8/2001 | Gambino et al. |
| 6,537,901 B2 | 3/2003 | Cha et al. |
| 6,586,808 B1 | 7/2003 | Xiang et al. |
| 6,630,720 B1 | 10/2003 | Maszara et al. |
| 6,667,199 B2 | 12/2003 | Torii et al. |
| 6,759,695 B2 | 7/2004 | Ma et al. |
| 6,794,234 B2 | 9/2004 | Polishchuk et al. |
| 6,856,808 B1 | 2/2005 | Comer et al. |
| 7,208,361 B2 | 4/2007 | Shah et al. |
| 7,365,015 B2 | 4/2008 | Lin et al. |
| 7,378,286 B2 | 5/2008 | Hsu et al. |
| 2005/0145894 A1 | 7/2005 | Chau et al. |
| 2005/0221548 A1 | 10/2005 | Doyle et al. |
| 2005/0224886 A1* | 10/2005 | Doyle et al. ................... 257/368 |
| 2006/0244079 A1* | 11/2006 | Wang et al. ................... 257/407 |
| 2008/0029757 A1 | 2/2008 | West et al. |
| 2008/0070356 A1 | 3/2008 | Brown et al. |
| 2008/0096338 A1 | 4/2008 | Zhang et al. |
| 2009/0166749 A1 | 7/2009 | Ichihara et al. |
| 2010/0140717 A1* | 6/2010 | Lavoie et al. ................. 257/369 |

* cited by examiner

*Primary Examiner* — Edward Wojciechowicz  
(74) *Attorney, Agent, or Firm* — Michael LeStrange; Roberts Mlotkowski Safran & Cole, P.C.

(57) ABSTRACT

A structure and method to create a metal gate having reduced threshold voltage roll-off. A method includes: forming a gate dielectric material on a substrate; forming a gate electrode material on the gate dielectric material; and altering a first portion of the gate electrode material. The altering causes the first portion of the gate electrode material to have a first work function that is different than a second work function associated with a second portion of the gate electrode material.

19 Claims, 10 Drawing Sheets

METAL GATE FET HAVING REDUCED THRESHOLD VOLTAGE ROLL-OFF

FIELD OF THE INVENTION

The invention generally relates to the fabrication of semiconductor circuit chips and, more particularly, to a structure and method to create a metal gate having reduced threshold voltage roll-off.

BACKGROUND

The channel length of metal oxide semiconductor field effect transistors (MOSFETs) is decreasing as the semiconductor device industry continually moves toward smaller devices. Sufficiently small channel lengths result in undesirable characteristics known as short channel effects, including threshold voltage roll-off (Vt-roll-off). Vt roll off with decreasing gate length is a source of variability and limits the process window for complimentary oxide semiconductor (CMOS) technologies. Structures with a laterally non-uniform gate work function are commonly used to alter the Vt-roll-off effect. However, many of the techniques used to make gate-first devices with non-uniform work function gates are not portable to the processes used in making damascene gates.

As opposed to a gate-first device, a gate-last device (also referred to as a replacement gate or damascene gate) is commonly formed by first depositing a high-k gate dielectric on a substrate, depositing polysilicon on the gate dielectric, and patterning the polysilicon into a dummy gate (e.g., a mandrel). Any desired spacers, implants (e.g., source, drain, halo, etc.), silicides, etc., are formed before an interlevel dielectric layer (ILD) is formed over the top of the structure. The ILD is then recessed down to the top of the polysilicon and the polysilicon dummy gate is stripped away, leaving a gate trench in the ILD. Metal is then deposited into the gate trench, resulting in a metal gate formed on a high-k gate dielectric. However, the processing steps involved in forming damascene gates pose unique challenges in the fabrication on a non-uniform (e.g., variable) work function gate.

Accordingly, there exists a need in the art to overcome the deficiencies and limitations described hereinabove.

SUMMARY

In a first aspect of the invention, there is a method of forming a semiconductor structure. The method includes: forming a gate dielectric material on a substrate; forming a gate electrode material on the gate dielectric material; and altering a first portion of the gate electrode material. The altering causes the first portion of the gate electrode material to have a first work function that is different than a second work function associated with a second portion of the gate electrode material.

In another aspect of the invention, there is a method for forming a semiconductor structure. The method includes: forming a gate dielectric material on a substrate; forming a first gate electrode material on the gate dielectric material and on sidewalls of a gate trench; removing a first portion of the gate electrode material from atop a first portion of the gate dielectric material; and forming a conductive material on the first portion of the gate dielectric material. A second portion of the gate electrode material remains on a second portion of the gate dielectric material after the removing, the gate electrode material has a first work function, and the conductive material has a second work function different than the first work function.

In another aspect of the invention, there is a method for forming a semiconductor structure. The method includes: forming a gate dielectric material on a substrate; forming a gate electrode material on the gate dielectric material and on sidewalls of a gate trench; forming a first reactive material on a first portion of the gate electrode material; forming a second reactive material on a second portion of the gate electrode material; and creating a non-uniform work function in the gate electrode material.

In another aspect of the invention, there is a semiconductor structure comprising: a gate dielectric material on a substrate; a gate electrode material on the gate dielectric material; and a replacement gate formed on the gate electrode material. The gate electrode material comprises a reacted first portion having a first work function, and the gate electrode material comprises a second portion having a second work function different than the first work function.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to the fabrication of semiconductor circuit chips and, more particularly, to a structure and method to create a metal gate having reduced threshold voltage roll-off. In accordance with aspects of the invention, work function establishing elements are distributed by diffusion into a contiguous metal gate. For example, in embodiments, an anisotropic etch of a diffusion-limiting film is performed in a damascene gate fabrication process. The etch is followed by a deposition of a film containing a diffusion species and a subsequent out-diffusion step, which introduces greater work function modification at the center of a channel as compared to the edge of the channel. In this manner, implementations of the invention may be used to provide a non-uniform work function in a replacement metal gate.

FIGS. 1-28 show views of structures and respective processing steps in accordance with aspects of the invention. For example, FIG. 1 shows a cross-section view of a semiconductor structure comprising a silicon-containing substrate 10.

Figure 1:
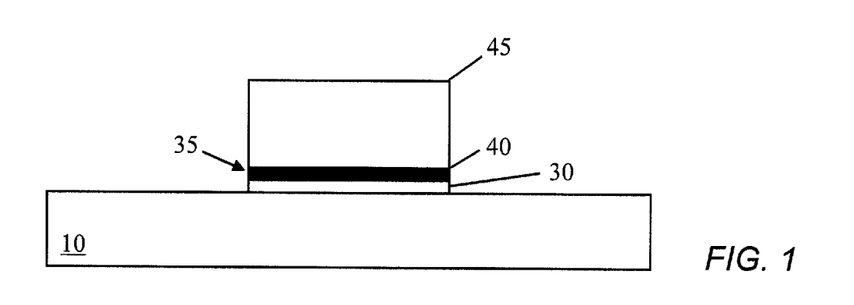
FIGS. 1-28 show views of structures and respective processing steps in accordance with aspects of the invention.

As depicted in FIG. 1, a gate dielectric 30 is formed on portions of the substrate 10. In embodiments, the gate dielectric 30 comprises a high-k gate dielectric such as a layer of hafnium oxide formed on the substrate 10. The hafnium oxide layer may have a depth (e.g., thickness) of about 15 to 20 Angstroms, while other thicknesses are contemplated by the present invention. Although not shown, the gate dielectric 30 may also comprise an optional layer of silicon dioxide ($SiO_2$) or oxynitride between the substrate 10 and the hafnium oxide layer. In embodiments, the gate dielectric 30 has a dielectric constant value of about 15, or greater. However, the invention is not limited to this particular arrangement of gate dielectric, and any suitable material or layers of materials may be used as the gate dielectric 30 in accordance with aspects of the invention. Moreover, the gate dielectric 30 may be formed using conventional deposition process such as, for example, chemical vapor deposition (CVD) or plasma-assisted CVD, or a thermal growing process such as oxidation, nitridation or oxynitridation.

In embodiments, a layer 35 of a first gate electrode material 40 is formed on the gate dielectric 30. The first gate electrode material 40 may comprise any suitable conductive material such as, for example, titanium nitride (TiN) or other material containing titanium or tungsten, The first gate electrode material 40 may have depth of about 100 to 200 Angstroms, or any other desired depth (e.g., thickness).

Still referring to FIG. 1, at least one polysilicon gate 45 (also referred to as a dummy gate and/or a mandrel) is formed atop the first gate electrode material 40. Although not shown, a barrier nitride layer may be conformally deposited over the entire structure, as is known, such that further explanation is not believed necessary for those of ordinary skill in the art practicing the present invention. The features shown in FIG. 1 may be formed using conventional semiconductor fabrication techniques. Also, although not shown, any suitable transistor features, such as spacers, implants (e.g., source, drain, halo, etc.), silicides, etc., may be formed with the structure of FIG. 1 using conventional semiconductor fabrication techniques. Moreover, implementations of the invention are not limited to use with any particular type of semiconductor substrate. Instead, embodiments of the invention may be implemented with any suitable substrate, including but not limited to: Si, SiGe, SiC, SiGeC, and layered semiconductors such as silicon-on-insulator (SOI), Si/SiGe, and SiGe-on-insulator (SGOI).

Figure 2:
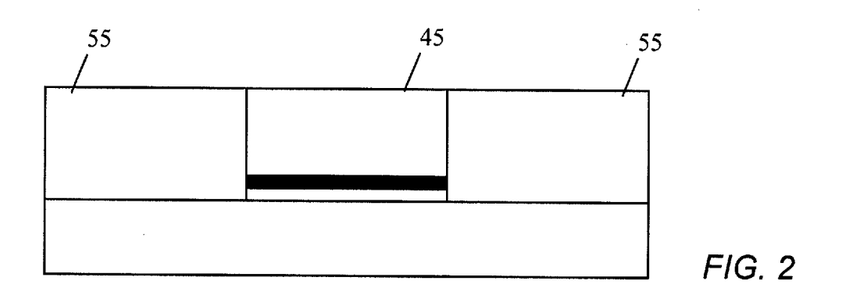

As depicted in FIG. 2, an ILD layer 55 is formed on the exposed upper surfaces of the structure. The ILD layer 55 may comprise any conventional dielectric material, e.g., silicon dioxide ($SiO_2$), tetraethylorthosilicate (TEOS), borophosphosilicate glass (BPSG), etc., formed in any conventional manner, e.g., chemical vapor deposition (CVD), etc. After forming the ILD layer 55, the structure is planarized such that the top surface of the ILD layer 55 is substantially coplanar with the top surface of the dummy gate 45. The planarization may be performed using any suitable technique, including but not limited to chemical mechanical polishing (CMP).

Figure 3:
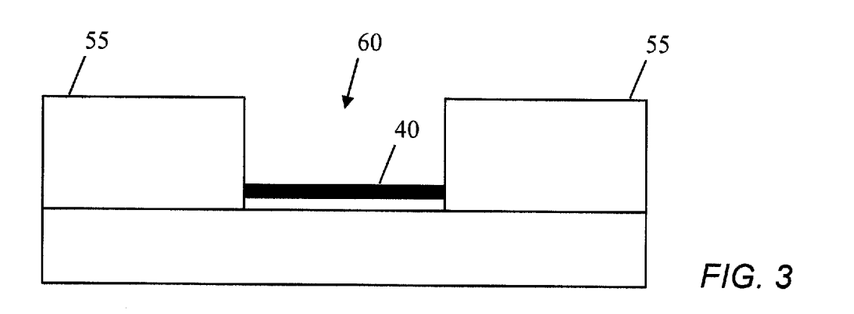

As depicted in FIG. 3, the dummy gate 45 is removed. In embodiments, the polysilicon material of the dummy gate 45 is stripped using a conventional selective wet etch, such as, for example, a bath of phosphoric acid. The removal of the dummy gate 45 results in a gate trench 60 in the ILD layer 55 and exposes the first gate electrode material 40.

Figure 4:
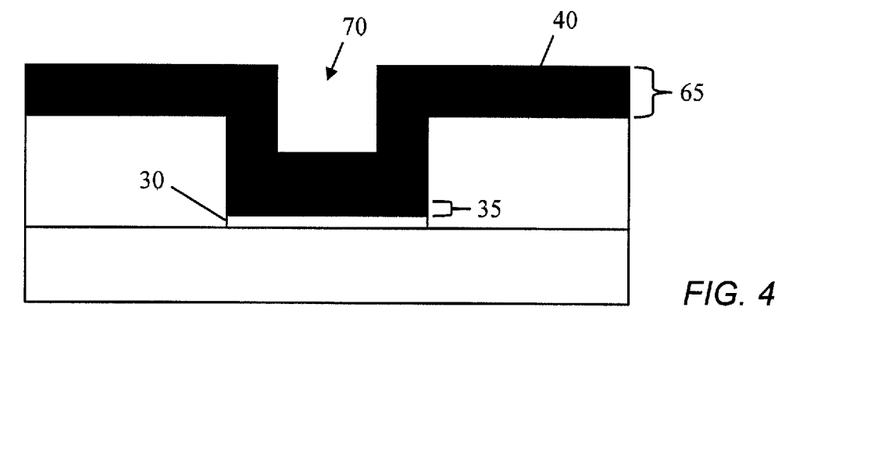

In accordance with aspects of the invention, FIG. 4 shows an additional layer 65 of the first gate electrode material 40 is conformally deposited on the exposed surfaces of the structure, including the sidewalls of the gate trench and the top surface of the layer 35. In embodiments, the first gate electrode material 40 (e.g., layers 35 and 65) does not completely fill the gate trench 60, but rather is conformally deposited to such a thickness to leave a trench 70 in the structure. For example, layer 65 may be conformally deposited to a thickness of about 2 nm, with other thicknesses contemplated by the present invention. The conformal deposition of layer 65 may be accomplished using known semiconductor fabrication techniques, including, but not limited to, atomic layer deposition (ALD), chemical vapor deposition (CVD), etc.

Figure 5:
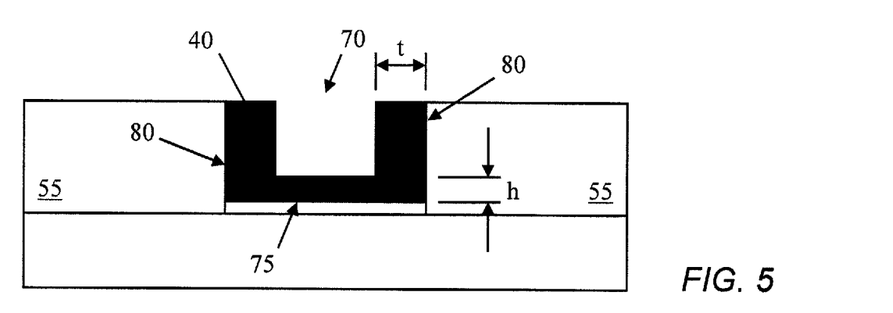

In embodiments, the first gate electrode material 40 is thinned at the base of the trench 70. As depicted in FIG. 5, this thinning results in a base portion 75 having a vertical height "h" that is less than a lateral thickness "t" of the sidewall portions 80 of the first gate electrode material 40. The thinning may also remove some or all of the first gate electrode material 40 from the top surface of the ILD layer 55. Additionally, a planarization step (e.g., CMP) may be employed to remove any unwanted portions of the first gate electrode material 40 from the top surface of the ILD 55.

In embodiments, the thinning is performed using a directional etch, such as an anisotropic reactive ion etch (RIE) process that selectively etches the first gate electrode material 40 in a substantially vertical direction. In embodiments, the vertical extent of the anisotropic RIE process may be controlled by adjusting the timing of the etch. In this manner, the vertical dimension of the resultant base portion 75 of the first gate electrode material 40 may be selectively controlled.

Figure 6:
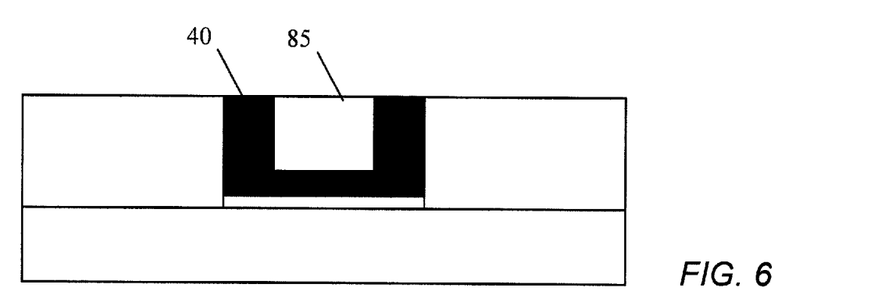

FIG. 6 shows a second gate-electrode material 85 deposited in the trench 70. In embodiments, the second gate-electrode material 85 is composed of a reacting or diffusing material and is different from the first gate electrode material 40. For example, the first gate electrode material 40 may be composed of TiN, and the second gate-electrode material 85 may comprise aluminum (Al). However, the invention is not limited to these materials, and any suitable electrically conductive materials may be used within the scope of the invention. The second gate-electrode material 85 may be deposited using any suitable conventional semiconductor fabrication process, such as CVD. As shown in FIG. 6, the upper surface of the structure may optionally be planarized (e.g., via CMP) after deposition of the second gate-electrode material 85.

Figure 7:
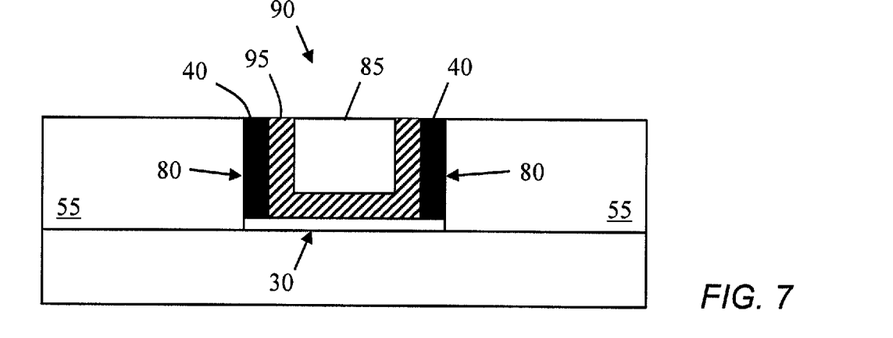

As depicted in FIG. 7, in accordance with aspects of the invention, a first portion of the first gate electrode material 40 is altered such that the first portion has a first work function that is different from a second work function of a second portion of the first gate electrode material 40. For example, in embodiments, the structure is subjected to a controlled anneal process that causes the second gate-electrode material 85 to diffuse into, or otherwise react with (e.g., alter), a first portion of the first gate electrode material 40. As described earlier, a base portion 75 of the first gate electrode material 40 has a vertical dimension that is less than a lateral dimension of sidewall portions 80 of the first gate electrode material 40. In embodiments, the temperature and time of the anneal is controlled such that ions from the second gate-electrode material 85 out-diffuse into the first gate electrode material 40 through substantially the entire height of the base portion 75 (e.g., down to the top of the gate dielectric 30), without diffusing laterally all the way through the sidewall portions 80 (e.g., to the sidewalls of the ILD layer 55). In embodiments, the anneal temperature may be about 400° C. to about 800° C. However, the invention is not limited to this particular temperature range, and any suitable temperature may be used within the scope of the invention.

According to aspects of the invention, the steps described thus far result in a gate 90 having the first gate electrode material 40 atop the lateral edges of the gate dielectric 30 and a reacted material 95 (e.g., the reacted first gate electrode material 40 and second gate-electrode material 85) atop the central portion of the gate dielectric 30. In embodiments, the composition of the first gate electrode material 40 and the second gate-electrode material 85 may be selected such that the first gate electrode material 40 and the reacted material 95 have different work functions. In this manner, implementations of the invention may be used to create a non-uniform work function gate using damascene gate (e.g., replacement gate) processes.

Figure 8:
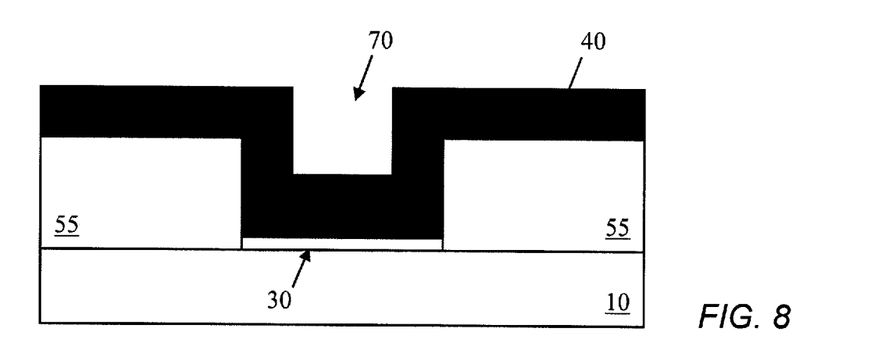
Figure 9:
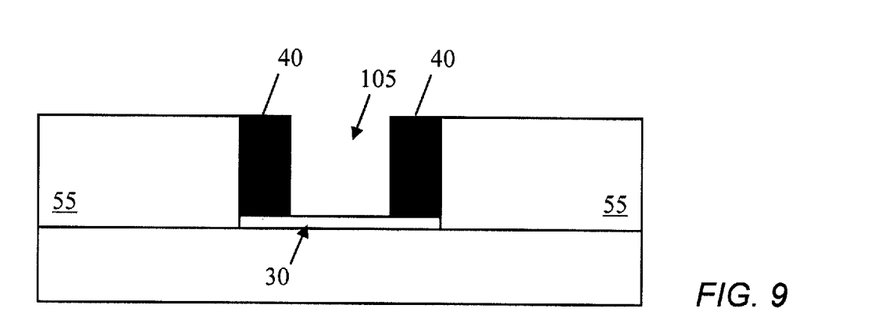
Figure 10:
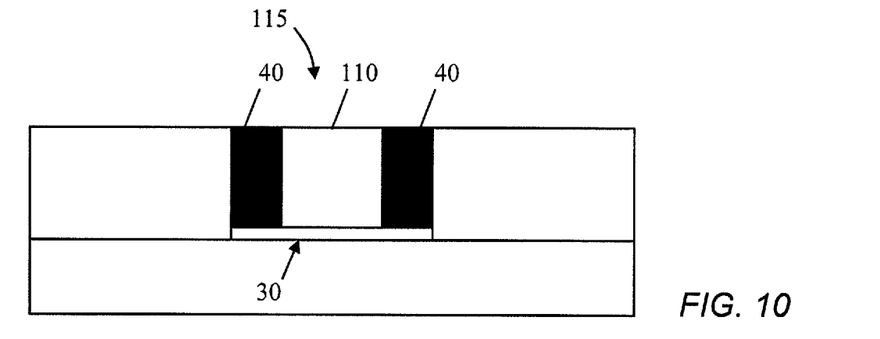

FIGS. 8-10 show aspects of an additional embodiment of the invention. More specifically, FIG. 8 shows a substrate 10, gate dielectric 30, ILD layer 55, first gate electrode material 40, and trench 70, all of which may be fabricated as described above with respect to FIGS. 1-4. As depicted in FIG. 9, portions of the first gate electrode material 40 are removed to expose a central portion of the gate dielectric 30. In embodiments, the removal may be accomplished using a directional etch, such as an anisotropic RIE process that selectively removes the first gate electrode material 40 in substantially the vertical direction. As shown in FIG. 9, the directional etch leaves vertical columns of the first gate electrode material 40 arranged on the sidewalls of the ILD layer 55 with a trench 105 defined therein. As also shown in FIG. 9, the directional etch may remove some or all of the first gate electrode material 40 from the top surface of the ILD layer 55.

In accordance with aspects of the invention, and as depicted in FIG. 10, a second gate electrode material 110 may be deposited in the trench 105 between the columns of the first gate material 40. In embodiments, the second gate-electrode material 110 is composed of a material having a different work function than the first gate electrode material 40. For example, the first gate electrode material 40 may be composed of TiN, and the second gate-electrode material 110 may comprise aluminum (Al). However, the invention is not limited to these materials, and any suitable materials may be used within the scope of the invention. The second gate-electrode material 110 may be deposited using any suitable conventional semiconductor fabrication process, such as CVD. As shown in FIG. 10, the upper surface of the structure may optionally be planarized (e.g., via CMP) after deposition of the second gate-electrode material 110.

As depicted in FIG. 10, the resultant structure comprises a gate 115 having lateral edges composed of the first gate electrode material 40 atop the gate dielectric 30. The gate 115 also comprises a center portion composed of the second gate electrode material 110 atop the gate dielectric 30. In embodiments, by using a first gate electrode material 40 having a different work function than the second gate electrode material 110, implementations of the invention can be used to fabricate a damascene gate having a non-uniform work function in which the lateral edges of the gate have a different work function than the center of the gate.

Figure 11:
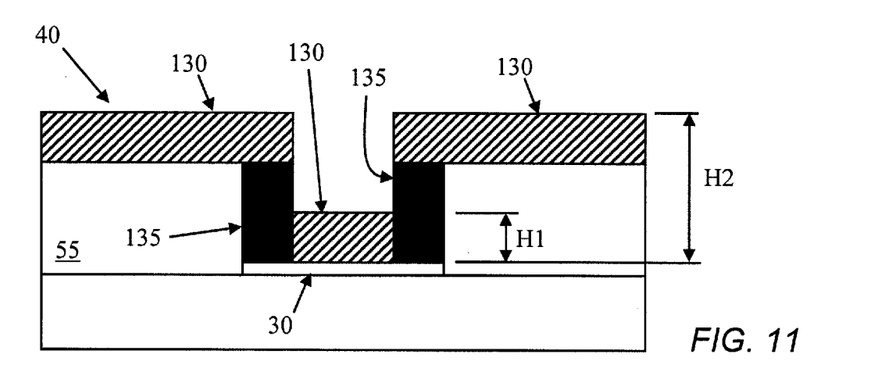
Figure 12:
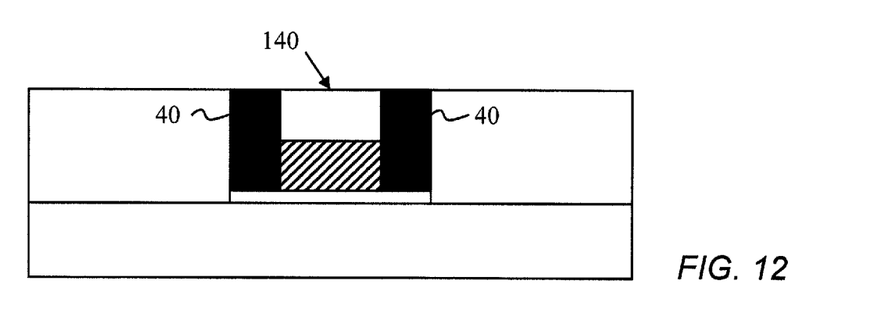

FIGS. 11 and 12 show aspects of another embodiment of the invention. In accordance with aspects of the invention, FIG. 11 shows a structure comprising a substrate 10, gate dielectric 30, and an ILD layer 55, all of which may be fabricated as described above with respect to FIGS. 1-4. The structure depicted in FIG. 11 also includes a layer of a first gate electrode material 40, which has been subject to an ion-implantation step (e.g., altered) to create doped portions 130 and undoped portions 135. For example, the structure depicted in FIG. 11 may be fabricated by subjecting the structure shown in FIG. 8 to an ion-implantation process.

In embodiments, the ion-implantation (e.g., doping) is performed at a substantially vertical angle or within about plus or minus five degrees from vertical. Additionally, the ion-implantation is performed at a sufficiently low energy such that ions are only implanted to a shallow depth that is substantially equal to a height "H1" of the base portion of the first gate electrode material 40, the height "H1" being less than a height "H2" of the sidewall portions of the first gate electrode material 40. In embodiments, the ion-implantation may be performed using any suitable species, including, but not limited to: carbon (C), oxygen (O), arsenic (As), boron (B), etc. Moreover, the ion-implantation may be performed at an energy of about 0.3 to 2 keV, depending on the species and the material 40 thickness. However, the invention is not limited to any particular ion-implant process, and any suitable species and energy may be used within the scope of the invention.

In accordance with aspects of the invention, the ion-implantation results in a doped central portion 130 and undoped lateral portions 135 of the first gate electrode material 40. The difference in dopant concentration between the doped central portion 130 and the undoped lateral portions 135 results in a difference in work function between the doped central portion 130 and the undoped lateral portions 135. As depicted in FIG. 12, the trench may be filled with any suitable gate conductor 140, which may be the same as or different than the first gate electrode material 40. Also, the structure may optionally be planarized. In this manner, implementations of the invention may be used to create a damascene gate having a non-uniform work function.

Figure 13:
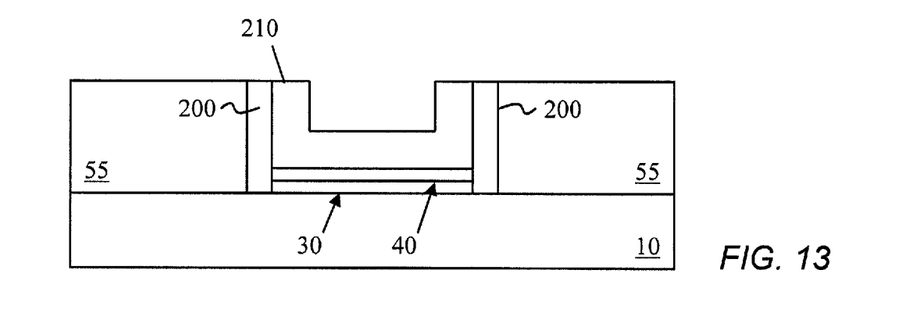

FIGS. 13-16 show aspects of an additional embodiment of the invention. In accordance with aspects of the invention, FIG. 13 shows an intermediate structure that may be formed during a damascene gate fabrication process. For example, the structure shown in FIG. 13 may be created by: forming a gate dielectric 30 on a substrate 10, forming a first gate electrode material 40 on the gate dielectric 30, forming a dummy gate (not shown) on the first gate electrode material 40, forming spacers 200 (e.g., oxide or nitride) on the sidewalls of the dummy gate, forming an ILD layer 55 on the substrate 10 around the gate stack, removing the dummy gate, and forming a barrier layer 210 in the gate trench created by the removal of the dummy gate, all of which may be performed using conventional fabrication techniques. For example, the barrier layer 210 may be formed using a conventional atomic layer deposition (ALD) or chemical vapor deposition (CVD) process. Moreover, the structure may be planarized (e.g., via CMP) after forming the barrier layer 210 (e.g., as shown in FIG. 13), or alternatively, portions of the barrier layer may be left on the upper surfaces of the ILD layer 55 (not shown in FIG. 13).

In embodiments, the gate dielectric 30 comprises hafnium oxide having a thickness of about 7 nm, the first gate electrode material 40 comprises TiN having a thickness of about 2 nm, and the barrier layer 210 comprises TiSiN having a thickness of about 4 nm. However, the invention is not limited to these materials and dimensions, and any suitable materials and dimensions may be used within the scope of the invention.

Figure 14:
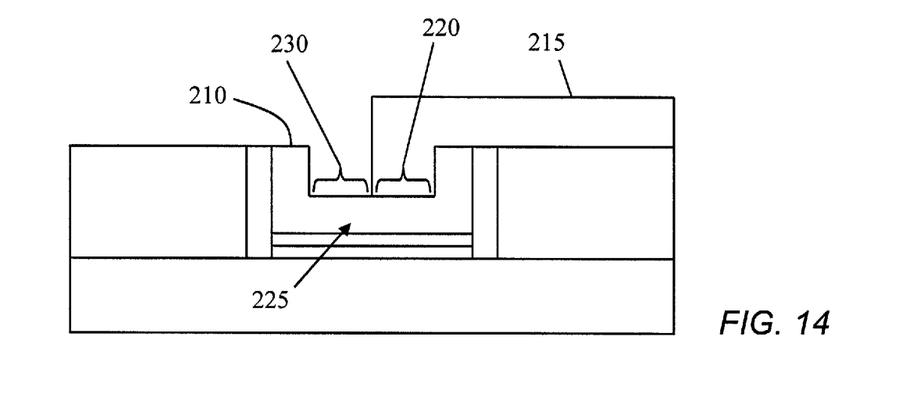

According to aspects of the invention, and as depicted in FIG. 14, a mask 215 is formed over part of the structure including a first portion 220 of a base 225 of the barrier layer 210. The mask 215 leaves a second portion 230 of the base 225 of the barrier layer 210 exposed. In embodiments, the mask 215 may be composed of hard mask or photoresist, and may be formed using conventional semiconductor fabrication techniques (e.g., photolithography).

Figure 15:
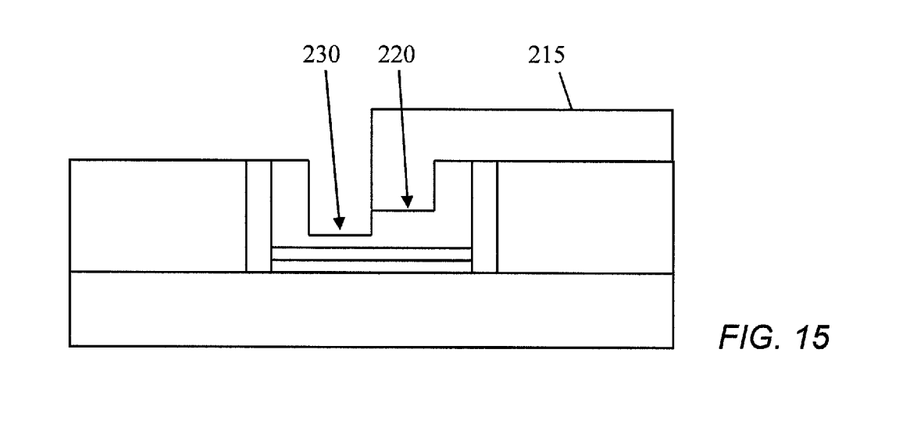

In embodiments, the exposed second portion 230 of the barrier layer 210 is thinned using a directional etch, such as, for example, an anisotropic RIE process. As depicted in FIG. 15, the mask 215 protects the first portion 220 during the etching such that the first portion 220 and second portion 230 have different heights after the etch.

Figure 16:
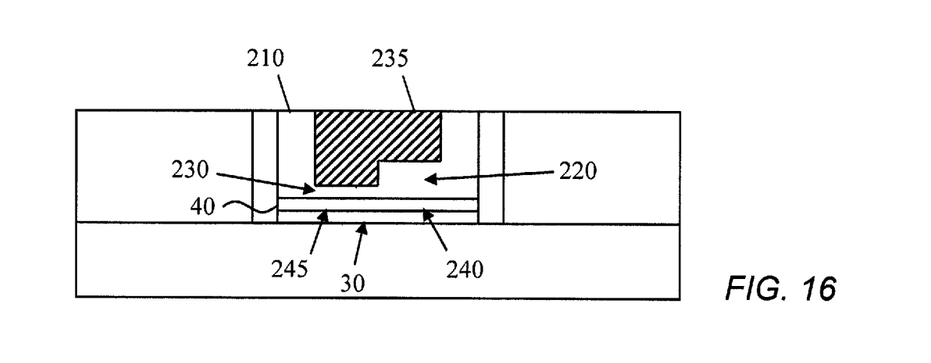

As depicted in FIG. 16, the mask 215 is removed (e.g., using conventional stripping processes), and a metal replacement gate material 235 is formed in the gate trench on the exposed surfaces of the barrier layer 210. In embodiments, the metal replacement gate material 235 is composed of a material that is capable of diffusing through the barrier layer 210 into the first gate electrode material 40. For example, the metal replacement gate material 235 may comprise aluminum (Al) and may be formed in the gate trench using conventional metal fill techniques, such as CVD, etc. A planarization step (e.g., CMP) may optionally be performed after the metal fill.

In accordance with aspects of the invention, the structure is annealed after the metal fill. In embodiments, the anneal may be performed at about 400° to about 800° C. (with other temperatures contemplated by the present invention) and causes ions from the metal replacement gate material 235 to diffuse through the barrier layer 210 into the first gate electrode material 40. Due to the difference in thickness between the first portion 220 and the second portion 230 of the base 225 of the barrier layer 210, the anneal causes more diffusion of the metal replacement gate material 235 through the thinner second portion 230 than the thicker first portion 220. The difference in the amount of diffusion results in a difference in dopant concentration between a first portion 240 and a second portion 245 of the first gate electrode material 40 atop the gate dielectric 30 (e.g., alters the first portion 240 relative to the second portion 245). The difference in dopant concentration results in a difference in work function between the first portion 240 and the second portion 245 of the first gate electrode material 40. In this manner, implementations of the invention may be used to create a replacement gate FET having a non-uniform work function.

Particularly, the damascene gate FET (e.g., replacement gate FET) shown in FIG. 16 and formed in accordance with aspects of the invention has an asymmetric work function across the gate dielectric. As described herein, the asymmetry (e.g., work function gradient) is attained by modulating the diffusion-limiting barrier film. In particular embodiments, the diffusion-limiting barrier film thickness is modulated using a lithographic definition and etch. The difference in thickness permits different amounts of the metal replacement gate to diffuse through the barrier film. This results in different work function on different portions of the device. Such a gate can be used, for example, to create a higher Vt on the source side of the channel.

Figure 17:
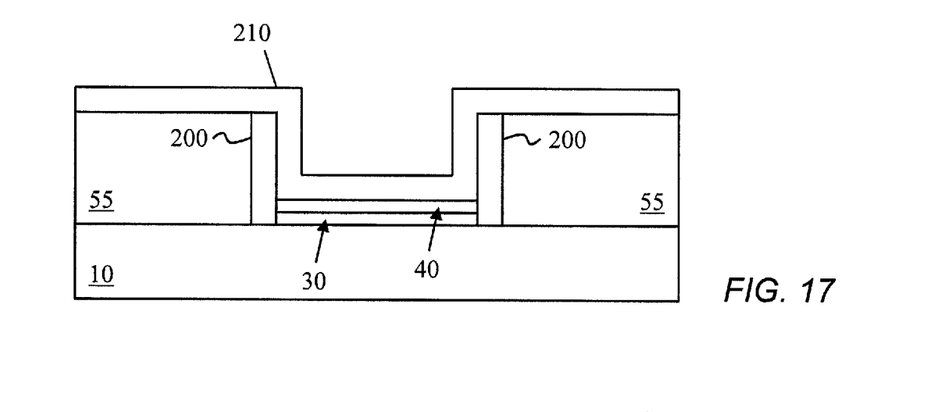

FIGS. 17-20 show aspects of another embodiment of the invention. In accordance with aspects of the invention, FIG. 17 shows structure similar to that described with respect to FIG. 13, including a substrate 10, gate dielectric 30, first gate electrode material 40, ILD layer 55, and barrier layer 210. However, in the structure of FIG. 17, portions of the barrier layer 210 have been left intact on the upper surfaces of the ILD layer 55. The structure shown in FIG. 17 may be created in the manner described above with respect to FIG. 13 by omitting a planarization step.

Figure 18:
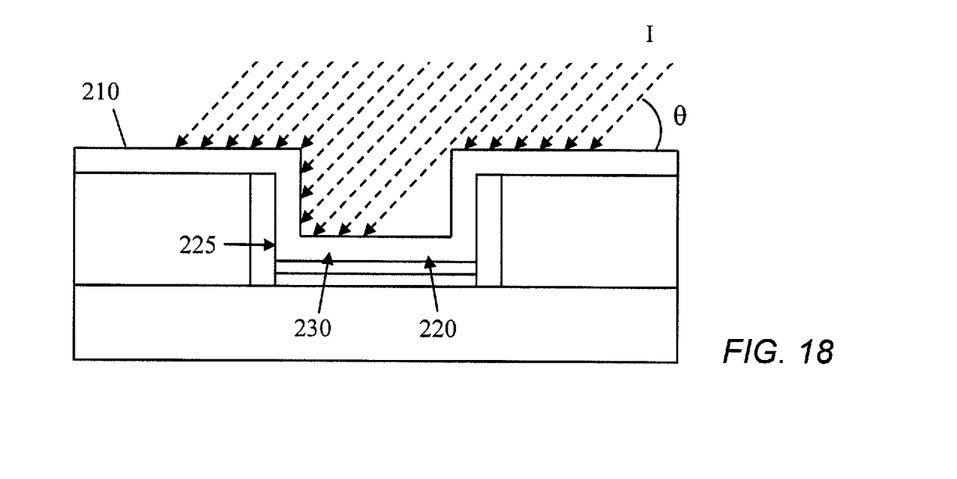

FIG. 18 diagrammatically shows an angled ion-implant process "I" in accordance with aspects of the invention. In embodiments, the ion-implantation is performed at an appropriate angle θ so that a first portion 220 of the base 225 of the barrier layer 210 is in a shadow (e.g., is shielded from the ion-implantation), while a second portion 230 is outside the shadow (e.g., is exposed to the ion-implantation). In this manner, the second portion 230 is doped by the angled ion-implant while the first portion 220 remains substantially unaffected by the angled ion-implant. In embodiments, the ion-implantation may be performed using any desired species, including but not limited to a noble gas such as xenon (Xe). In implementations of the invention the implant may be performed at any suitable angle θ that will shadow (e.g., prevent) a first portion of the barrier layer 210 from being doped. Moreover, the angled ion-implant may be performed at suitable energy so as to be contained in the second portion of base layer 225, such as, but not limited to, about 0.3 to 1 keV.

Figure 19:
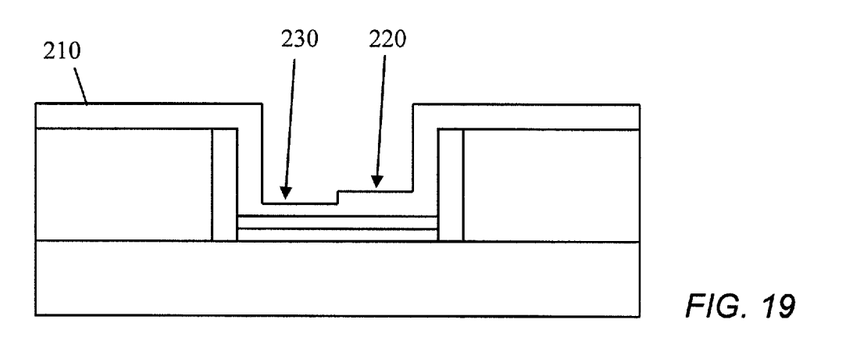

After the angled ion-implant, the barrier layer 210 is etched using a conventional etch process (e.g., RIE), whereby the second portion 230 is etched faster than the first portion 220 due to the doping of the second portion 230. Accordingly, as depicted in FIG. 19, the first portion 220 and second portion 230 have different heights after the etching.

Figure 20:
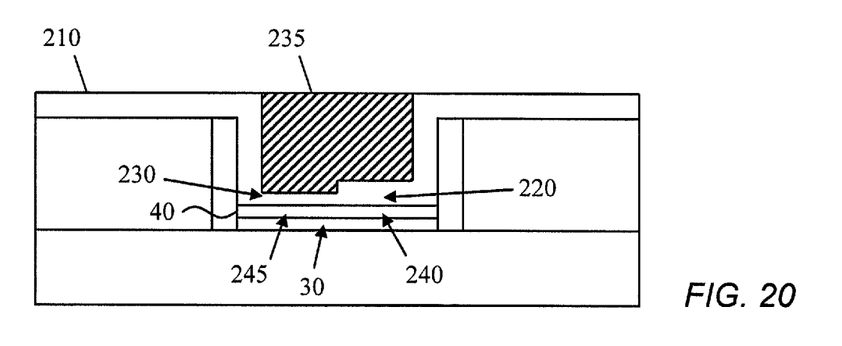

As shown in FIG. 20, a metal replacement gate material 235 is formed in the gate trench on the exposed surfaces of the barrier layer 210, and the structure is annealed to cause ions from the metal replacement gate material 235 to diffuse through the barrier layer 210 into the first gate electrode material 40. In embodiments, the formation of the metal replacement gate material 235 and the annealing may be performed in the manner described above with respect to FIG. 16. Due to the difference in thickness between the first portion 220 and the second portion 230 of the base 225 of the barrier layer 210, the anneal causes more diffusion of the metal replacement gate material 235 through the thinner second portion 230 than the thicker first portion 220. The difference in the amount of diffusion results in a difference in dopant concentration between a first portion 240 and a second portion 245 of the first gate electrode material 40 atop the gate dielectric 30 (e.g., alters the first portion 240 relative to the second portion 245). The difference in dopant concentration results in a difference in work function between the first portion 240 and the second portion 245 of the first gate electrode material 40. In this manner, implementations of the invention may be used to create a replacement gate FET having a non-uniform work function.

Particularly, the damascene gate FET (e.g., replacement gate FET) shown in FIG. 20 and formed in accordance with aspects of the invention has an asymmetric work function across the gate dielectric. As described herein, the asymmetry (e.g., work function gradient) is attained by modulating the diffusion-limiting barrier film. In particular embodiments, the diffusion-limiting barrier film thickness is modulated using an angled implant that uses geometry and topography of the replacement structure to implant only one side of the barrier film. The implanted side of the barrier film has a different etch rate than the non-implanted side, which results in a difference in thickness when the two sides are etched simultaneously. The difference in thickness permits different amounts of a metal replacement gate to diffuse through different portions the barrier film. This results in different work function on different portions of the device. Such a gate can be used, for example, to create a higher Vt on the source side of the channel.

Figure 21:
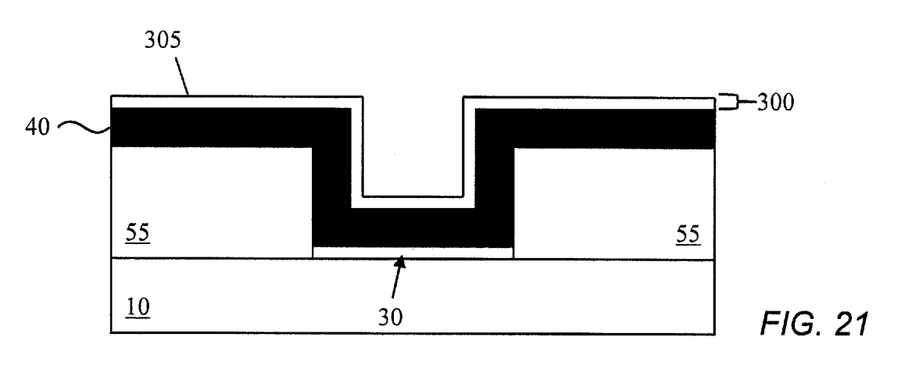

FIGS. 21-24 show aspects of another embodiment of the invention. In accordance with aspects of the invention, FIG. 21 shows a structure comprising a substrate 10, gate dielectric 30, ILD layer 55, and first gate electrode material 40, all of which may be fabricated as described above with respect to FIGS. 1-4. In embodiments, a layer 300 of a first reacting material 305 is deposited on the exposed surfaces. The first reacting material 305 may comprise any suitable gate conductor material that is capable of reacting with (e.g., diffusing into) the first gate electrode material 40. For example, the first reacting material 305 may comprise, but is not limited to, lanthanum (La). In embodiments, the layer 300 of the first reacting material 305 may be formed using any suitable conventional technique, such as ALD, CVD, etc., and may be formed having a thickness of, for example, about 2 nm.

Figure 22:
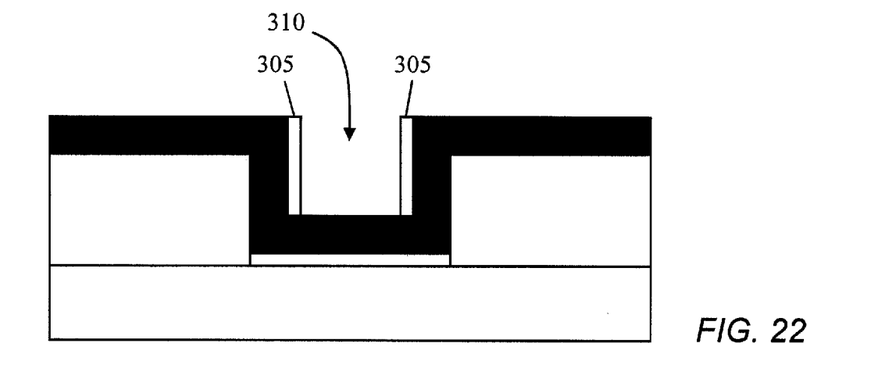

As depicted in FIG. 22, exposed horizontal portions of the first reacting material 305 are selectively removed. In embodiments, the removal step comprises a directional etch, such as a selective anisotropic RIE process. In accordance with aspects of the invention, the directional etch leaves vertical sidewalls of the first reacting material 305 in the gate trench 310.

Figure 23:
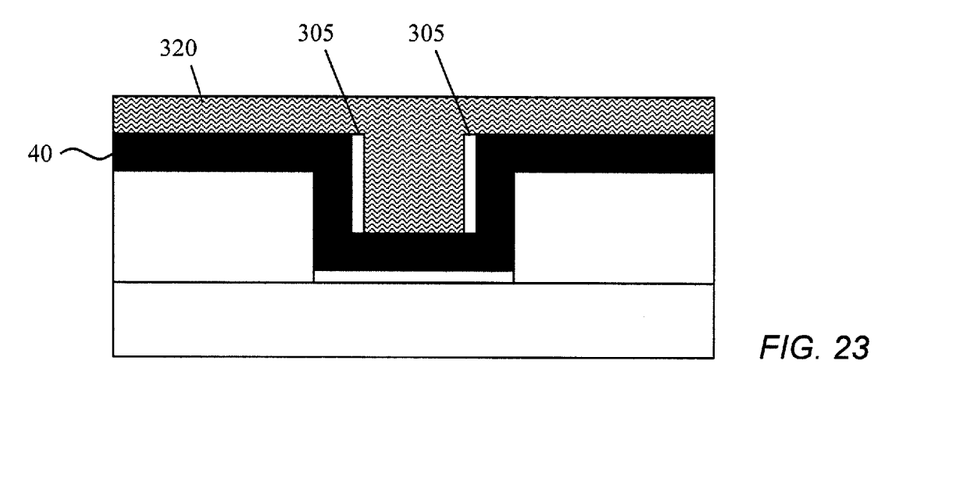

In accordance with aspects of the invention, FIG. 23 shows a second reacting material 320 deposited on the exposed surfaces of the structure. In embodiments, the second reacting material 320 may comprise any suitable gate conductor material that is capable of reacting with (e.g., diffusing into) the first gate electrode material 40 and is different from the first reacting material 305. For example, the second reacting material 320 may comprise, but is not limited to, aluminum (Al). In embodiments, the second reacting material 320 may be deposited using conventional metal fill techniques, such as CVD.

Figure 24:
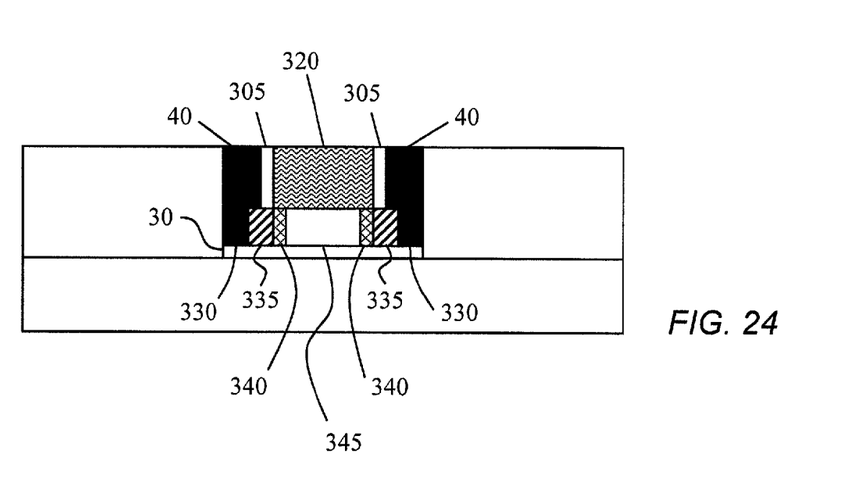

As depicted in FIG. 24, the structure may be planarized, e.g., via CMP. In accordance with further aspects of the invention, the structure is annealed to cause the first reacting material 305 and the second reacting material 320 to out-diffuse over a limited range into the first gate electrode material 40. In embodiments, the process parameters of the anneal are controlled so that the species diffuse down through substantially the entire thickness of the first gate electrode material 40 (e.g., to the top of the gate dielectric 30), but do not diffuse laterally enough to create a uniform material atop the entirety of the gate dielectric 30. For example, the anneal may be performed at a temperature of about 400° C. to about 800° C.

In accordance with aspects of the invention, the diffusion of species into the first gate electrode material 40 creates multiple regions of differing material composition atop the gate dielectric 30. For example, using the exemplary materials described herein for explanation purposes, first regions 330 comprise unreacted TiN, second regions 335 comprise TiN doped with La, third regions 340 comprise TiN doped with La and Al, and a fourth region 345 comprises TiN doped with Al. In embodiments, the materials of the first gate electrode material 40, the first reacting material 305, and the second reacting material 320 are selected so that the resulting regions (e.g., regions 330, 335, 340, 345) atop the gate dielectric 30 have different work functions. In this manner, implementations of the invention may be used to create a replacement metal gate having a non-uniform work function.

Figure 25:
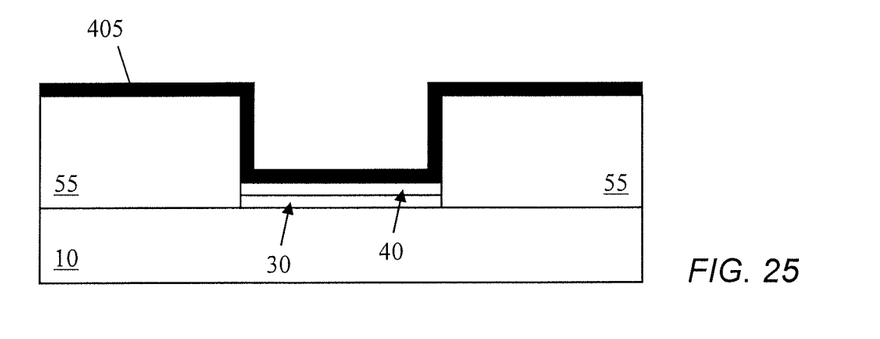

FIGS. 25-28 show aspects of another embodiment of the invention. In accordance with aspects of the invention, FIG. 25 shows a structure comprising a substrate 10, gate dielectric 30, first gate electrode material 40, and an ILD layer 55, all of which may be fabricated as already described herein. In embodiments, a layer of diffusing material 405 is conformally deposited on the exposed surfaces. For example, the structure shown in FIG. 25 may be made by conformally depositing the diffusing material 405 on the exposed surfaces of the structure described with respect to FIG. 3. The diffusing material 405 may comprise any suitable gate conductor, such as aluminum (Al), and may be deposited using conventional techniques, such as AVD, CVD, etc. In embodiments, the layer of diffusing material 405 has a thickness of about 3 nm to about 30 nm.

Figure 26:
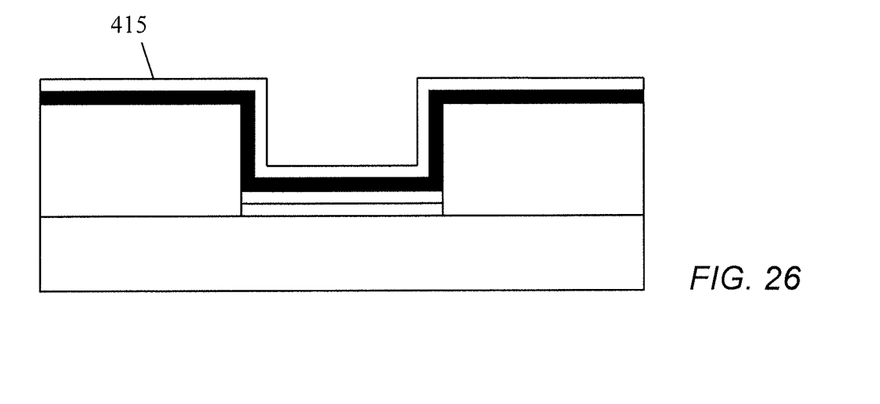

FIG. 26 shows a barrier layer 415 deposited on the structure, in accordance with aspects of the invention. In embodiments, the barrier layer 415 comprises TiSiN and has a thickness of about 5 nm. However, the invention is not limited to this particular material or thickness, and any desired material and thickness may be used.

Figure 27:
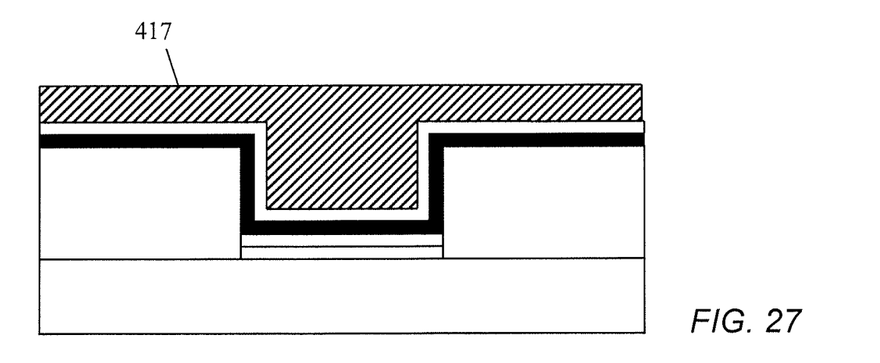

As depicted in FIG. 27, a gate conductor 417 is deposited on the structure. In embodiments, the gate conductor 417 comprises aluminum (Al) or doped polysilicon, and is deposited using CVD. However, other types of gate conductor materials may be used within the scope of the invention.

Figure 28:
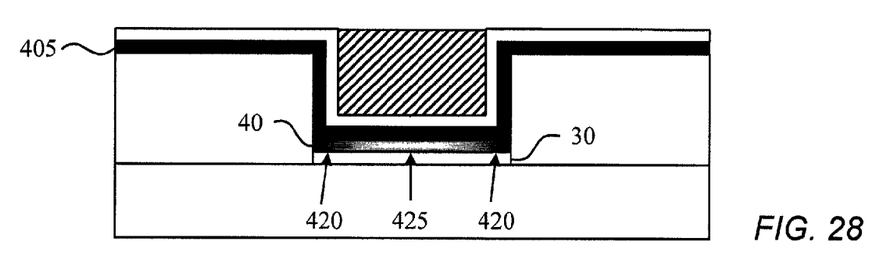

As depicted in FIG. 28, the structure may be planarized, e.g., via CMP. In accordance with further aspects of the invention, the structure is annealed to cause the diffusing material 405 to out-diffuse over a limited range into the first gate electrode material 40 atop the gate dielectric 30. In embodiments, the lateral edges 420 of the first gate electrode material 40 are subject to relatively more diffusion from the diffusing material 405 because the horizontal and vertical portions of the diffusing material 405 contribute to the diffusion in these areas. On the other hand, the central portion 425 of the first gate electrode material 40 is subject to relatively less diffusion from the diffusing material 405 because only the horizontal portion of the diffusing material 405 contributes to the diffusion in this area. As such, the lateral edges 420 have a different work function than the central portion 425. In this manner, implementations of the invention may be used to create a replacement metal gate having a non-uniform work function.

Figure 29:
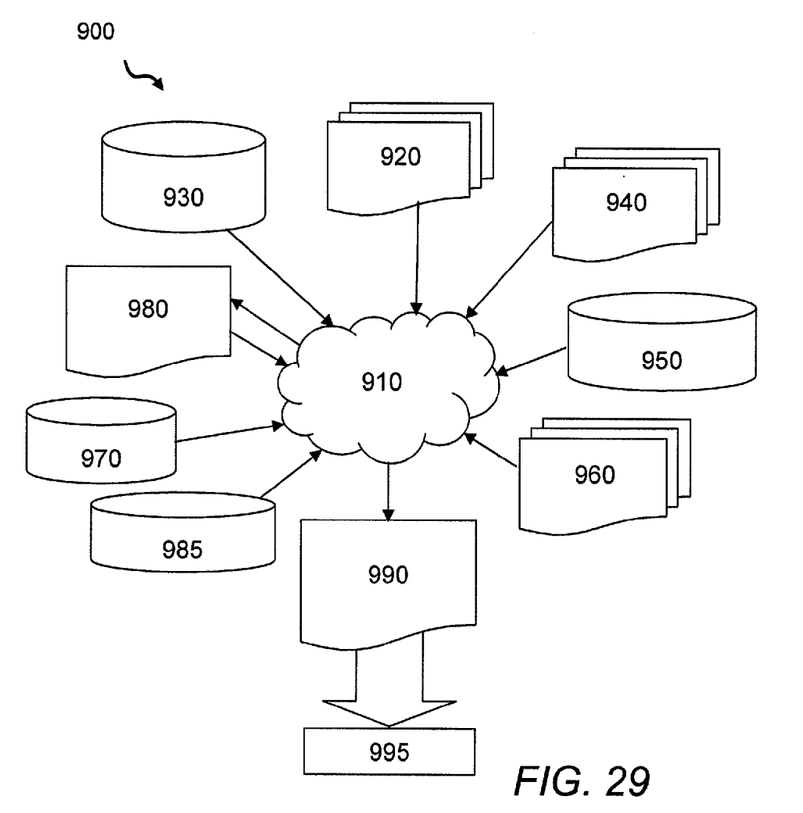
FIG. 29 is a flow diagram of a design process used in semiconductor design, manufacture, and/or test.

FIG. 29 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-28. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 29 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-28. As such, design structure 920 may comprise files or other data structures including human and/ or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-28 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-28. In one embodiment, design structure 990 may comprise a compiled, executable HDL simulation model that functionally simulates the devices shown in FIGS. 1-28.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-28. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure using a replacement gate process, comprising:
   forming a gate dielectric material on a substrate;
   forming a gate electrode material on the gate dielectric material;
   forming a mandrel on the gate electrode material;
   forming a dielectric material at sides of the mandrel;
   removing the mandrel to form a trench;
   forming an additional layer of the gate electrode material in the trench;
   forming a second gate electrode material on the additional layer of the gate electrode material; and
   altering a first portion of the gate electrode material,
   wherein the altering causes the first portion of the gate electrode material to have a first work function that is different than a second work function associated with a second portion of the gate electrode material.

2. The method of claim 1, wherein the second gate electrode material is different than the gate electrode material, and
   the altering comprises diffusing the second gate electrode material into the first portion of the gate electrode material.

3. The method of claim 2, further comprising thinning the additional layer of the gate electrode material before the filling the trench with the second gate electrode material.

4. The method of claim 3, wherein the thinning causes the additional layer of the gate electrode material to have a vertical height that is less than a lateral thickness of a sidewall portion of the gate electrode material.

5. A method of forming a semiconductor structure, comprising:
   forming a gate dielectric material on a substrate;
   forming a gate electrode material on the gate dielectric material;
   forming a barrier layer over the gate electrode material;
   thinning a second portion of the barrier layer relative to a first portion of the barrier layer;
   forming a metal replacement gate material on exposed surfaces of the barrier layer in a trench defined by the barrier layer; and
   diffusing ions from the metal replacement gate material into the gate electrode material, wherein the diffusing causes a first portion of the gate electrode material to have a first work function that is different than a second work function associated with a second portion of the gate electrode material.

6. The method of claim 5, wherein the diffusing comprises:
   diffusing a first amount of the metal replacement gate material through the first portion of the barrier layer into the first portion of the gate electrode material, and
   diffusing a second amount of the metal replacement gate material through the second portion of the barrier layer into the second portion of the gate electrode material.

7. The method of claim 6, wherein the second amount is different than the first amount due to the thinning.

8. The method of claim 5, wherein the thinning comprises:
   masking the first portion of the barrier layer, and
   etching the second portion of the barrier layer.

9. The method of claim 5, wherein the thinning comprises:
   performing an angled ion-implant of the barrier layer such that ions are implanted in the second portion of the barrier layer, and
   simultaneously etching the first and second portions of the barrier layer.

10. The method of claim 5, wherein the first and second portions of the gate electrode material provide an asymmetric work function for a FET comprising the metal replacement gate material.

11. A method of forming a semiconductor structure, comprising:
    forming a gate dielectric material on a substrate;
    forming a gate electrode material on the gate dielectric material;
    forming a diffusing material on the gate electrode material and on sidewalls of a gate trench containing the gate electrode material;
    forming a barrier layer on the diffusing material;
    forming a gate conductor in a trench defined by the barrier layer;
    annealing the semiconductor structure, wherein the annealing causes diffusion from the diffusing material into the gate electrode material, and wherein the diffusion causes a first portion of the gate electrode material to have a first work function that is different than a second work function associated with a second portion of the gate electrode material.

12. A method of forming a semiconductor structure, comprising:
    forming a gate dielectric material on a substrate;
    forming a first layer of a gate electrode material on the gate dielectric material;
    forming a mandrel on the first layer of the gate electrode material;
    forming an interlevel dielectric layer on the substrate and at sides of the mandrel;
    removing the mandrel, wherein the removing forms a gate trench defined by the interlevel dielectric layer, and wherein the removing exposes a surface of the first layer of the gate electrode material;
    forming an additional layer of the gate electrode material on the surface of the first layer of the gate electrode material and on sidewalls of the gate trench;
    removing a first portion of the first layer of the gate electrode material and the additional layer of the gate electrode material from atop a first portion of the gate dielectric material; and
    forming a conductive material on the first portion of the gate dielectric material,
    wherein a second portion of the first layer of the gate electrode material and the additional layer of the gate electrode material remains on a second portion of the gate dielectric material after the removing,
    the gate electrode material has a first work function,
    the conductive material has a second work function different than the first work function, and
    the removing comprises etching the first portion of the gate electrode material using an anisotropic etch.

13. A method of forming a semiconductor structure, comprising:
    forming a gate dielectric material on a substrate;
    forming a gate electrode material on the gate dielectric material and on sidewalls of a gate trench;
    forming a first reacting material on a first portion of the gate electrode material;

forming a second reacting material on a second portion of the gate electrode material, wherein the second reacting material is composed of a different material than the first reacting material; and creating a non-uniform work function in the gate electrode material.

14. The method of claim 13, wherein the creating the non-uniform work function comprises annealing the semiconductor structure to diffuse the first reacting material and the second reacting material into regions of the gate electrode material.

15. The method of claim 14, wherein the forming the first reacting material on the first portion of the gate electrode material comprises:

conformally depositing a layer of the first reacting material on horizontal and vertical surfaces of the gate electrode material; and removing the first reacting material from the horizontal surfaces of the gate electrode material.

16. The method of claim 12, wherein the anisotropic etch selectively etches the gate electrode material in a substantially vertical direction and leaves vertical columns of the gate electrode material on walls of the interlevel dielectric layer.

17. The method of claim 12, wherein the additional layer of the gate electrode material is formed directly on a top surface of the interlevel dielectric layer.

18. The method of claim 11, wherein:

the first portion of the gate electrode material includes lateral edges of the gate electrode material; and the second portion of the gate electrode material includes a central portion of the gate electrode material.

19. The method of claim 13, wherein the first reacting material comprises lanthanum and the second reacting material comprises aluminum.

* * * * *